(12) United States Patent
Corman

(10) Patent No.: US 8,030,998 B2
(45) Date of Patent: Oct. 4, 2011

(54) ACTIVE FEED FORWARD AMPLIFIER

(75) Inventor: David W. Corman, Gilbert, AZ (US)

(73) Assignee: ViaSat, Inc., Carlsbad, CA (US)

( * ) Notice: Subject to any disclaimer, the term of this patent is extended or adjusted under 35 U.S.C. 154(b) by 0 days.

(21) Appl. No.: 12/759,064

(22) Filed: Apr. 13, 2010

(65) Prior Publication Data

US 2010/0259326 A1 Oct. 14, 2010

Related U.S. Application Data

(60) Provisional application No. 61/237,967, filed on Aug. 28, 2009, provisional application No. 61/259,375, filed on Nov. 9, 2009, provisional application No. 61/234,513, filed on Aug. 17, 2009, provisional application No. 61/222,354, filed on Jul. 1, 2009, provisional application No. 61/168,913, filed on Apr. 13, 2009, provisional application No. 61/259,049, filed on Nov. 6, 2009, provisional application No. 61/234,521, filed on Aug. 17, 2009, provisional application No. 61/265,605, filed on Dec. 1, 2009, provisional application No. 61/222,363, filed on Jul. 1, 2009.

(51) Int. Cl.
   *H03F 1/00* (2006.01)
(52) U.S. Cl. .......................... 330/151; 330/149
(58) Field of Classification Search .................. 330/151, 330/149
   See application file for complete search history.

(56) References Cited

U.S. PATENT DOCUMENTS

| | | | |
|---|---|---|---|
| 3,119,965 A | 1/1964 | Phillips | |
| 4,857,777 A | 8/1989 | Altes | |
| 4,896,374 A | 1/1990 | Waugh et al. | |
| 4,965,602 A | 10/1990 | Kahrilas et al. | |
| 4,994,773 A | 2/1991 | Chen et al. | |
| 5,270,719 A | 12/1993 | Roth | |
| 6,061,553 A | 5/2000 | Matsuoka et al. | |
| 6,232,837 B1 * | 5/2001 | Yoo et al. | 330/151 |
| 6,326,845 B1 | 12/2001 | Miyaji et al. | |
| 7,319,345 B2 | 1/2008 | Farjad-rad et al. | |

(Continued)

FOREIGN PATENT DOCUMENTS

EP 0762660 3/1997

(Continued)

OTHER PUBLICATIONS

International Search Report and Written Opinion dated Oct. 27, 2010, PCT/US10/030876, 8 pages.

(Continued)

*Primary Examiner* — Henry Choe
(74) *Attorney, Agent, or Firm* — Snell & Wilmer L.L.P.

(57) ABSTRACT

An exemplary embodiment of the feed forward amplifier replaces traditional distributed directional couplers, splitters, and delay lines. Moreover, an exemplary feed forward amplifier architecture combines active implementations of RF couplers, power splitters, and/or time delay elements in a novel fashion allowing for ultra-compact size and broadband performance. In an exemplary embodiment, a feed forward amplifier has a main amplifier path and an error amplifier path. The feed forward amplifier comprises a main amplifier in the main amplifier path, and at least one active vector generator in the error amplifier path. The at least one active vector generator is configured to adjust the phase and amplitude of an error amplifier path signal and an error amplifier is configured to receive the adjusted error amplifier path signal. Furthermore, the adjusted error amplifier path signal and an amplified signal are combined to form the output signal of the feed forward amplifier.

18 Claims, 4 Drawing Sheets

U.S. PATENT DOCUMENTS

| | | |
|---|---|---|
| 7,355,470 B2 | 4/2008 | Sorrells et al. |
| 7,378,902 B2 | 5/2008 | Sorrells et al. |
| 7,408,507 B1 | 8/2008 | Paek et al. |
| 7,421,036 B2 | 9/2008 | Sorrells et al. |
| 7,620,129 B2 | 11/2009 | Sorrells et al. |
| 7,746,764 B2 | 6/2010 | Rawlins et al. |
| 7,750,733 B2 | 7/2010 | Sorrells et al. |
| 7,885,682 B2 | 2/2011 | Sorrells et al. |
| 2002/0113648 A1 | 8/2002 | Miyaji et al. |
| 2003/0016085 A1 | 1/2003 | Yamazaki |
| 2003/0162566 A1 | 8/2003 | Shapira et al. |
| 2005/0113052 A1 | 5/2005 | Rabinovich |
| 2005/0151698 A1 | 7/2005 | Mohamadi |
| 2006/0170499 A1 | 8/2006 | Rahman et al. |
| 2007/0248186 A1 | 10/2007 | Sorrells et al. |
| 2007/0275674 A1 | 11/2007 | Chien |
| 2008/0129408 A1 | 6/2008 | Nagaishi et al. |
| 2009/0091384 A1 | 4/2009 | Sorrells et al. |
| 2010/0073085 A1 | 3/2010 | Sorrells et al. |
| 2010/0097138 A1 | 4/2010 | Sorrells et al. |
| 2010/0225389 A1 | 9/2010 | Teetzel |

FOREIGN PATENT DOCUMENTS

| | | |
|---|---|---|
| EP | 1193861 | 4/2002 |
| JP | 2003168938 | 6/2003 |
| WO | WO9945609 | 8/1999 |
| WO | W00003456 | 1/2000 |
| WO | WO0241442 | 5/2002 |
| WO | WO03036756 | 5/2003 |

OTHER PUBLICATIONS

International Search Report and Written Opinion dated Nov. 18, 2010, PCT/US10/30871, 10 pages.

International Search Report and Written Opinion dated Nov. 26, 2010, PCT/US10/30868, 10 pages.

International Search Report and Written Opinion dated Nov. 26, 2010, PCT/US10/30877, 10 pages.

Tokumitsu et al.—Active isolator, combiner, divider and magic-T as miniaturized function blocks dated Nov. 6, 1998.

International Search Report and Written Opinion dated Nov. 26, 2010, PCT/US10/30866, 8 pages.

Aminghasem Safarian et al., Distributed Active Power Combiners and Splitters for Multi-Antenna UWB.

Viallon et al. An Original SiGe Active Differential Output Power Splitter for Millimetre-wave Applications, 2003.

International Search Report and Written Opinion dated Nov. 26, 2010, PCT/US10/30892, 9 pages.

International Search Report and Written Opinion dated Nov. 26, 2010, PCT/US10/30872, 9 pages.

Hsiao Analysis of Interleaved Arrays of Nov. 1971.

International Search Report and Written Opinion dated Nov. 30, 2010, PCT/US10/30906, 11 pages.

International Search Report and Written Opinion dated Jul. 19, 2010,PCT US10/030881,149 pages.

International Search Report and Written Opinion dated Aug. 23, 2010, PCT/US2010/30864, 12 pages.

Kwang-Jin, Koh, Gabriel M. Rebeiz, 0.13-mu m CMOS phase shifters for X-, Ku, and K-band phased arrays, IEEE Journal of Solid State Circuits, 2007, 14 pages.

Kwang-Jin, Koh, Jason W. May, Gabriel M. Rebeiz A Q-Band (40-45 GHz) 16-Element Phased-Array Transmitter in 0.18-μm SiGe BiCMOS Technology, IEEE Radio Frequency Integrated Circuits Symposium, 2008, 4 pages.

Kwang-Jin, Koh, Gabriel M. Rebeiz, An X- and Ku-Band 8-Element Phased-Array Receiver in 0.18-μm SiGe BiCMOS Technology, IEEE Journal of Solid State Circuits, Jun. 2008, 12 pages.

Strassberg, Dan, "RF-vector-signal generator combines high throughput, low phase noise," EDN, Oct. 6, 2009, 2 pp., UBM Electronics.

Zheng et al., "Full 360 degree Vector-Sum Phase-Shifter for Microwave System Applications," IEEE Transactions on Circuits and Systems I: Regular Papers, Downloaded on Jul. 8, 2009, pp. 1-7.

Ayari et al., "Automatic Test Vector Generation for Mixed-Signal Circuits," 1995, Ecole Polytechnique of the University of Montreal, 6 pages.

\* cited by examiner

ACTIVE FEED FORWARD AMPLIFIER

CROSS REFERENCE TO RELATED APPLICATIONS

This application is a non-provisional of U.S. Provisional Application No. 61/237,967, entitled "ACTIVE BUTLER AND BLASS MATRICES," which was filed on Aug. 28, 2009. This application is also a non-provisional of U.S. Provisional Application No. 61/259,375, entitled "ACTIVE HYBRIDS FOR ANTENNA SYSTEMS," which was filed on Nov. 9, 2009. This application is a non-provisional of U.S. Provisional Application No. 61/234,513, entitled "ACTIVE FEED FORWARD AMPLIFIER," which was filed on Aug. 17, 2009. This application is a non-provisional of U.S. Provisional Application No. 61/222,354, entitled "ACTIVE PHASED ARRAY ARCHITECTURE," which was filed on Jul. 1, 2009. This application is a non-provisional of U.S. Provisional Application No. 61/168,913, entitled "ACTIVE COMPONENT PHASED ARRAY ANTENNA," which was filed on Apr. 13, 2009. This application is also a non-provisional of U.S. Provisional Application No. 61/259,049, entitled "DYNAMIC REAL-TIME POLARIZATION FOR ANTENNAS," which was filed on Nov. 6, 2009. This application is a non-provisional of U.S. Provisional Application No. 61/234,521, entitled "MULTI-BAND MULTI-BEAM PHASED ARRAY ARCHITECTURE," which was filed on Aug. 17, 2009. This application is a non-provisional of U.S. Provisional Application No. 61/265,605, entitled "HALF-DUPLEX PHASED ARRAY ANTENNA SYSTEM," which was filed on Dec. 1, 2009. This application is a non-provisional of U.S. Provisional Application No. 61/222,363, entitled "BIDIRECTIONAL ANTENNA POLARIZER," which was filed on Jul. 1, 2009. All of the contents of the previously identified applications are hereby incorporated by reference for any purpose in their entirety.

BACKGROUND OF THE INVENTION

In general, radio frequency (RF) amplifiers do not provide pure linear amplification and produce undesired spurious or intermodulation products at the amplifier output. Various techniques are implemented to improve amplifier linearity, including pre-distortion, post-distortion, and different feedback configurations. Another technique is the feed forward amplifier. Generally, a feed forward amplifier comprises directional couplers, delay lines, and amplitude control elements that are configured to cancel undesired intermodulation products. However, these distributed components result in a bulky and expensive amplifier. Additionally, a typical feed forward amplifier is operational only over a narrow band of frequencies, typically less than 10% bandwidth. In general, the bandwidth of a prior art feed forward amplifier is inherently limited by a distributed solution of the multiple couplers.

Thus, a need exists for a fully integrated monolithic solution of a feed forward amplifier. Furthermore, a need exists for a feed forward amplifier that is compact and cost effective. Also, a need exists for a feed forward amplifier that has a tunable bandwidth across a wide frequency range.

SUMMARY

In an exemplary embodiment, a feed forward amplifier is implemented as a fully monolithic silicon germanium (SiGe) based architecture. The feed forward amplifier may be used in communication applications that require low intermodulation products. An exemplary embodiment of the feed forward amplifier replaces traditional distributed directional couplers, splitters, and delay lines. Moreover, an exemplary feed forward amplifier architecture combines active implementations of RF couplers, power splitters, and/or time delay elements in a novel fashion allowing for ultra-compact size and broadband performance. In an exemplary embodiment, the feed forward amplifier replaces the directional couplers with active splitters and active combiners. Similarly, the delay lines and amplitude adjustment elements are replaced by active vector generators. The vector generators adjust the gain and phase of the error signal and are software reconfigurable for optimal spurious signal cancellation.

In accordance with an exemplary embodiment, a feed forward amplifier has a main amplifier path and an error amplifier path. The feed forward amplifier comprises a main amplifier in the main amplifier path, and at least one active vector generator in the error amplifier path. The active vector generator is configured to adjust the phase and amplitude of an error amplifier path signal while an error amplifier, in the error amplifier path, is configured to receive the adjusted error amplifier path signal. Furthermore, in an exemplary embodiment, an active combiner is configured to combine the adjusted error amplifier path signal and an amplified signal from the main signal path. The resulting combined signal is the output signal of the feed forward amplifier.

BRIEF DESCRIPTION OF THE DRAWING FIGURES

A more complete understanding of the present invention may be derived by referring to the detailed description and claims when considered in connection with the drawing figures, wherein like reference numbers refer to similar elements throughout the drawing figures, and:

DETAILED DESCRIPTION OF THE INVENTION

While exemplary embodiments are described herein in sufficient detail to enable those skilled in the art to practice the invention, it should be understood that other embodiments may be realized and that logical material, electrical, and mechanical changes may be made without departing from the spirit and scope of the invention. Thus, the following detailed description is presented for purposes of illustration only.

A feed forward amplifier corrects for the distortion injected by an amplifier using a forward loop. Specifically, the feed forward amplifier corrects the amplitude and phase distortion that results from the non-linear characteristics of an amplifier. In an exemplary embodiment, a feed forward amplifier comprises an error compensation loop that generates an error cancellation signal that is subtracted from the amplified and distorted main signal. In an exemplary embodiment, a feed forward amplifier is comprised of various components. The various components may include a vector generator, an active power splitter, an active power combiner, or the like. Furthermore, the embodiments described in this application may include passive components, discrete components, or other monolithic components in place of the active components so long as at least one active component is present. For example, one or more of the splitters and combiners could be a passive component.

Figure 1:
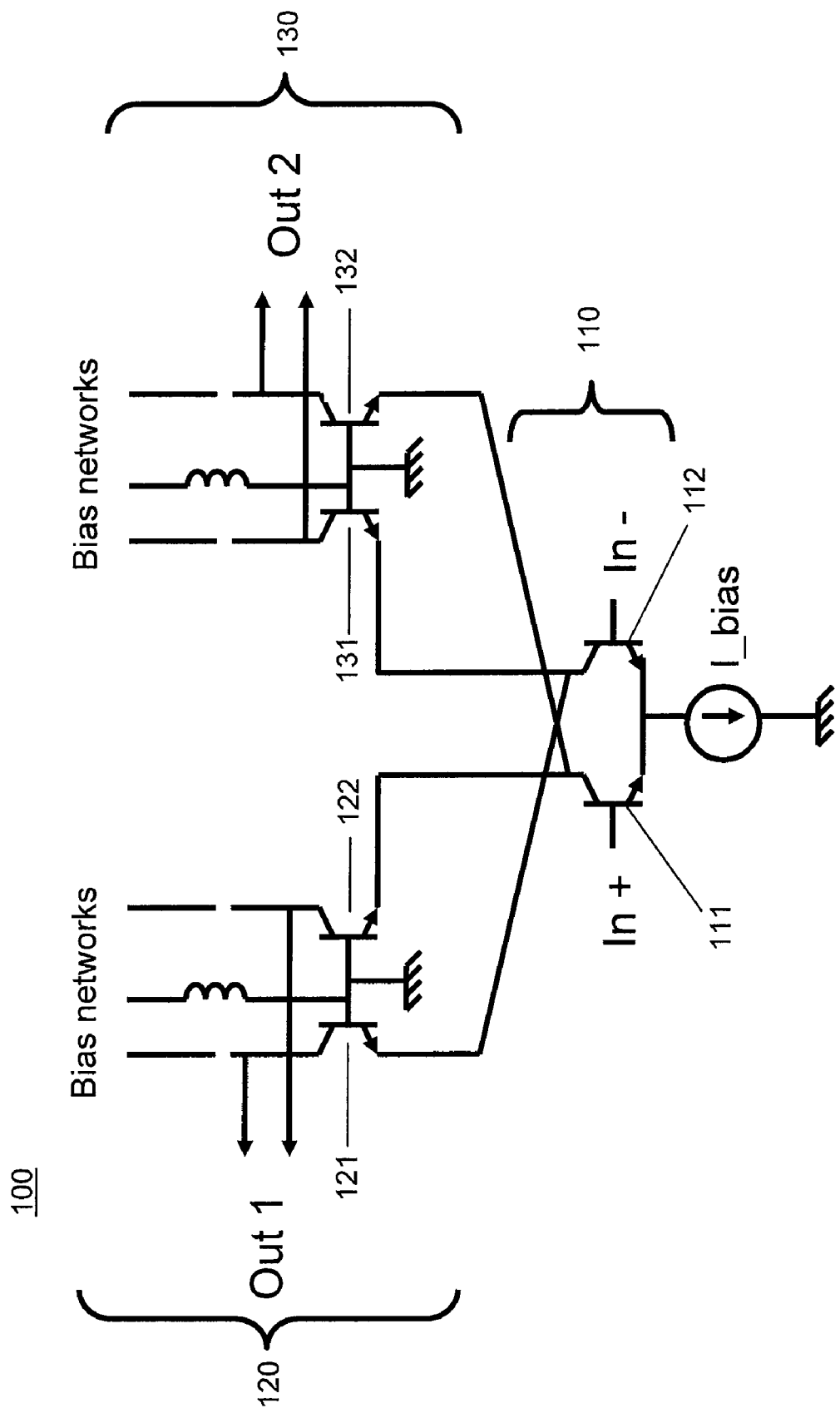
FIG. 1 illustrates an exemplary embodiment of an active power splitter.

Active Splitter: FIG. 1 illustrates a schematic of an exemplary active power splitter. In an exemplary embodiment, an active power splitter 100 comprises a differential input subcircuit 110, a first differential output subcircuit 120, and a second differential output subcircuit 130. The differential input subcircuit 110 has paired transistors 111, 112 with a common emitter node and is constant current biased, as is typical in a differential amplifier. An input signal is communicated to the base of paired transistors 111, 112 in the differential input subcircuit 110. Both the first and second differential output subcircuits 120, 130 comprise a pair of transistors with a common base node and each common base is connected to ground.

The first differential output subcircuit 120 has a first transistor 121 emitter connected to the collector of one of the input subcircuit transistors 112. The emitter of the second output subcircuit transistor 122 is connected to the collector of the other input subcircuit transistor 111. In the exemplary embodiment, the first output is drawn from the collectors of transistors 121, 122 of the first differential output subcircuit 120. Furthermore, the second differential output subcircuit 130 is similarly connected, except the transistor 131, 132 emitters are inversely connected to the input subcircuit transistor 111, 112 collectors with respect to transistors 121, 122.

By inverting the input subcircuit transistor collector connections between the first and second differential output subcircuits, the first output and the second output are approximately 180° out of phase with each other. In another exemplary embodiment, transistor 131, 132 emitters are non-inversely connected to input sub circuit transistor 111, 112 collectors, causing the first output and the second output to be approximately in phase with each other. In general, the absolute phase shift of the output signals through the power splitter is not as important as the relative phasing between the first and second output signals.

In an exemplary embodiment, active power splitter 100 converts an input RF signal into two output signals. The output signal levels may be equal in amplitude, though this is not required. For a prior art passive power splitter, each output signal would be about 3 dB lower in power than the input signal. In contrast, an exemplary active splitter, such as active power splitter 100, can provide gain and the relative power level between the input signal and the output signal is adjustable and can be selectively designed. In an exemplary embodiment, the output signal is configured to achieve a substantially neutral or positive power gain over the input signal. For example, the output signal may achieve a 3 dB signal power gain over the input signal. In an exemplary embodiment, the output signal may achieve a power gain in the 0 dB to 5 dB range. Moreover, the output signal may be configured to achieve any suitable power gain.

In accordance with an exemplary embodiment, active power splitter 100 produces output signals with a differential phase between the two signals that is zero or substantially zero. The absolute phase shift of output signals through the active power splitter may not be as important as the differential phasing between the output signals.

In another exemplary embodiment, active power splitter 100 additionally provides matched impedances at the input and output ports. The matched impedances may be 50 ohms, 75 ohms, or other suitable impedances. Furthermore, in an exemplary embodiment, active splitter 100 provides isolation between the output ports of the active power splitter. In one exemplary embodiment, active power splitter 100 is manufactured as a radio frequency integrated circuit (RFIC) with a compact size that is independent of the operating frequency due to a lack of distributed components.

Figure 2:
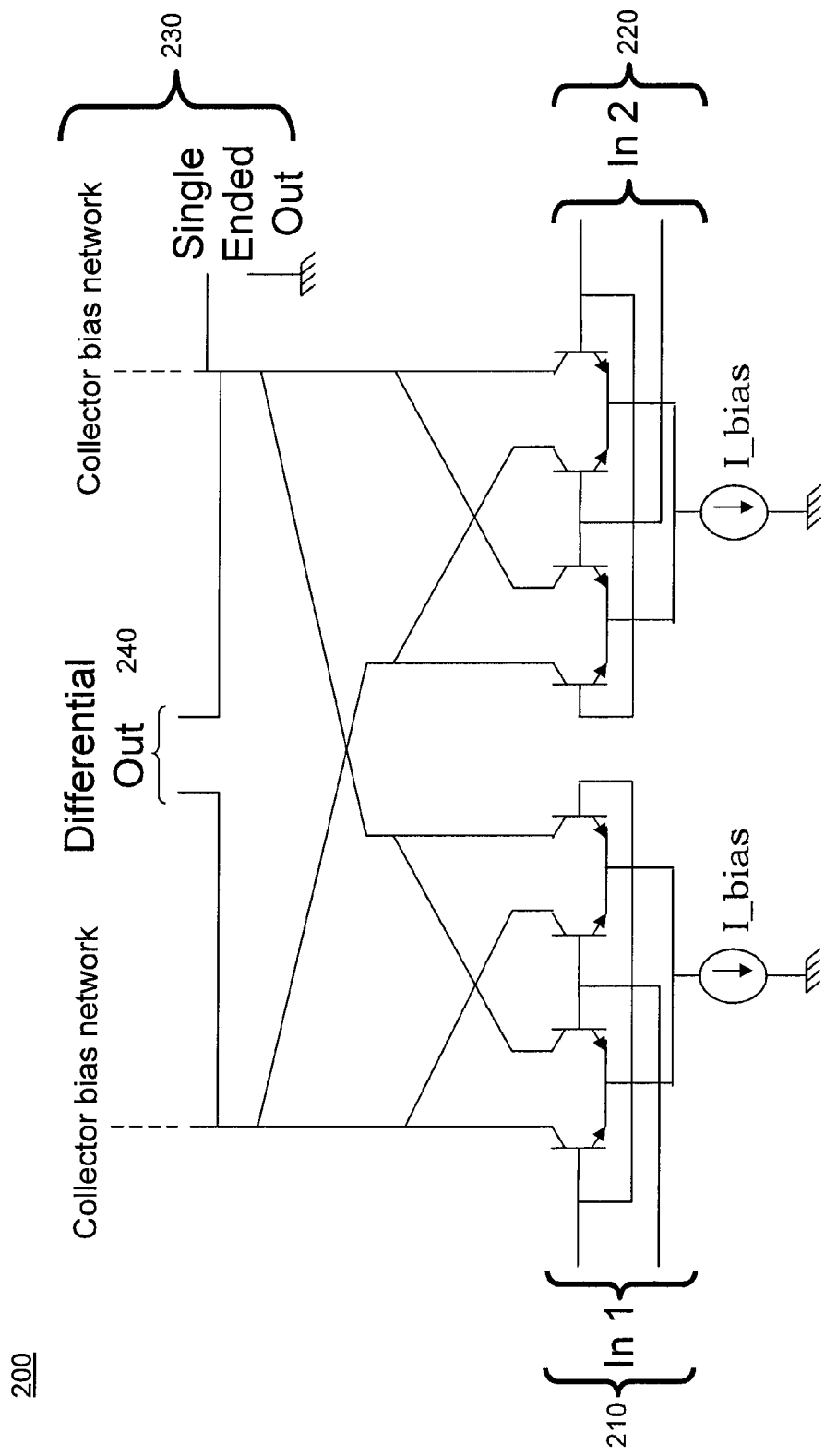
FIG. 2 illustrates an exemplary embodiment of an active power combiner.

Active Combiner: In an exemplary embodiment and with reference to FIG. 2, an active power combiner 200 comprises a first differential input subcircuit 210, a second differential input subcircuit 220, a single ended output subcircuit 230, and a differential output subcircuit 240. Each differential input subcircuit 210, 220 includes two pairs of transistors, with each transistor of each differential input subcircuit 210, 220 having a common emitter node with constant current biasing, as is typical in a differential amplifier.

A first input signal is communicated to the bases of the transistors in first differential input subcircuit 210. For example, a first line of input signal In1 is provided to one transistor of each transistor pair in first differential input subcircuit 210, and a second line of input signal In1 is provided to the other transistor of each transistor pair. Similarly, a second input signal is communicated to the bases of the transistors in second differential input subcircuit 220. For example, a first line of input signal In2 is provided to one transistor of each transistor pair in first differential input subcircuit 220, and a second line of input signal In2 is provided to the other transistor of each transistor pair. Furthermore, in an exemplary embodiment, a differential output signal is formed by a combination of signals from collectors of transistors in first and second differential input subcircuits 210, 220.

In an exemplary embodiment, active power combiner 200 converts two input RF signals into a single output signal. The output signal can either be a single ended output at single ended output subcircuit 230, or a differential output at differential output subcircuit 240. In other words, active power combiner 200 performs a function that is the inverse of active power splitter 100. The input signal levels can be of arbitrary amplitude and phase. Similar to an active power splitter, active power combiner 200 can provide gain and the relative power level between the inputs and output is also adjustable and can be selectively designed. In an exemplary embodiment, the output signal achieves a substantially neutral or positive signal power gain over the input signal. For example, the output signal may achieve a 3 dB power gain over the sum of the input signals. In an exemplary embodiment, the output signal may achieve a power gain in the 0 dB to 5 dB range. Moreover, the output signal may achieve any suitable power gain.

In an exemplary embodiment, active power combiner 200 additionally provides matched impedances at the input and output ports. The matched impedances may be 50 ohms, 75 ohms, or other suitable impedances. Furthermore, in an exemplary embodiment, active power combiner 200 provides isolation between the input ports of the power combiner. In one exemplary embodiment, active power combiner 200 is manufactured as a RFIC with a compact size that is independent of the operating frequency due to a lack of distributed components.

Vector Generator: In an exemplary embodiment, a vector generator converts an RF input signal into an output signal (sometimes referred to as an output vector) that is shifted in phase and/or amplitude to a desired level. This replaces the function of a typical phase shifter and adds the capability of amplitude control. In other words, a vector generator is a magnitude and phase control circuit. In the exemplary embodiment, the vector generator accomplishes this function by feeding the RF input signal into a quadrature network resulting in two output signals that differ in phase by about 90°. The two output signals are fed into parallel quadrant select circuits, and then through parallel variable gain amplifiers (VGAs). In an exemplary embodiment, the quadrant select circuits receive commands and may be configured to either pass the output signals with no additional relative phase shift between them or invert either or both of the output signals by an additional 180°. In this fashion, all four possible quadrants of the 360° continuum are available to both orthogonal signals. The resulting composite output signals from the current summer are modulated in at least one of amplitude and phase.

Figure 3:
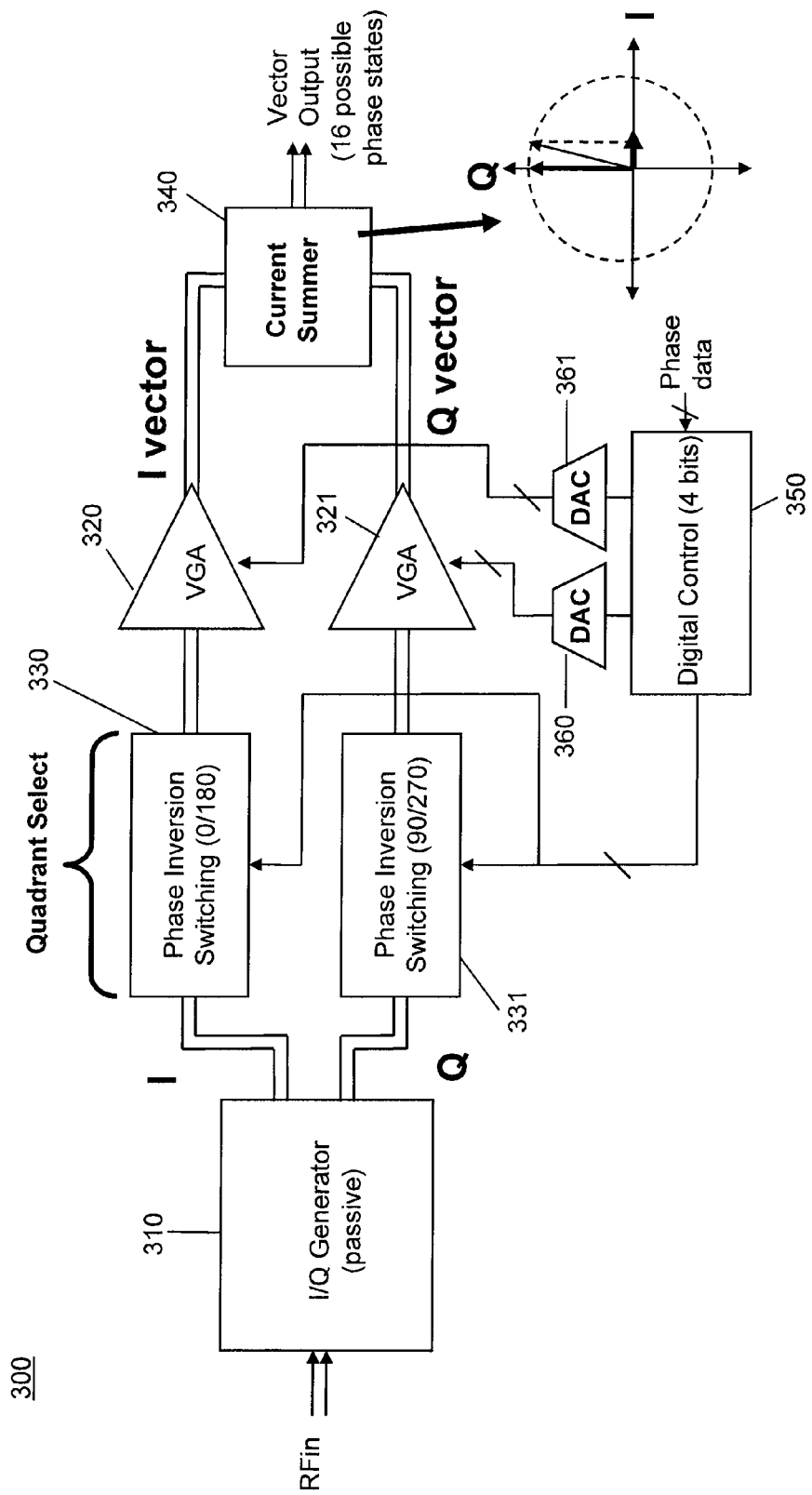
FIG. 3 illustrates an exemplary embodiment of an active vector generator.

In accordance with an exemplary embodiment and with reference to FIG. 3, a vector generator 300 comprises a passive I/Q generator 310, a first VGA 320 and a second VGA 321, a first quadrant select 330 and a second quadrant select 331 each configured for phase inversion switching, and a current summer 340. The first quadrant select 330 is in communication with I/Q generator 310 and first VGA 320. The second quadrant select 331 is in communication with I/Q generator 310 and second VGA 321. Furthermore, in an exemplary embodiment, vector generator 300 comprises a digital controller 350 that controls a first digital-to-analog converter (DAC) 360 and a second DAC 361. The first and second DACs 360, 361 control first and second VGAs 321, 320, respectively. Additionally, digital controller 350 controls first and second quadrant selects 330, 331.

In an exemplary embodiment, vector generator 300 controls the phase and amplitude of an RF signal by splitting the RF signal into two separate vectors, the in-phase (I) vector and the quadrature-phase (Q) vector. In one embodiment, the RF signal is communicated differentially. The differential RF signal communication may be throughout vector generator 300 or limited to various portions of vector generator 300. In another exemplary embodiment, the RF signals are communicated non-differentially. The I vector and Q vector are processed in parallel, each passing through the phase inverting switching performed by first and second quadrant selects 330, 331. The resultant outputs of the phase inverting switches comprise four possible signals: a non-inverted I, an inverted I, a non-inverted Q, and an inverted Q. In this manner, all four quadrants of a phasor diagram are available for further processing by VGAs 320, 321. In an exemplary embodiment, two of the four possible signals non-inverted I, inverted I, non-inverted Q, and inverted Q are processed respectively through VGAs 320, 321, until the two selected signals are combined in current summer 340 to form a composite RF signal. The current summer 340 outputs the composite RF signal with phase and amplitude adjustments. In an exemplary embodiment, the composite RF signal is in differential signal form. In another exemplary embodiment, the composite RF signals are in single-ended form.

In an exemplary embodiment, control for the quadrant shifting and VGA functions is provided by a pair of DACs. In an exemplary embodiment, reconfiguration of digital controller 350 allows the number of phase bits to be digitally controlled after vector generator 300 is fabricated if adequate DAC resolution and automatic gain control (AGC) dynamic range exists. In an exemplary embodiment with adequate DAC resolution and AGC dynamic range, any desired vector phase and amplitude can be produced with selectable fine quantization steps using digital control. In another exemplary embodiment, reconfiguration of DACs 360, 361 can be made after vector generator 300 is fabricated in order to facilitate adjustment of the vector amplitudes. In one exemplary embodiment, the size of vector generator 300 is independent of the operating frequency.

Active Feed Forward Amplifier:

In accordance with an exemplary embodiment, a feed forward amplifier comprises active components manufactured on silicon germanium (SiGe) in a monolithic solution. Other materials may be used, such as GaAs, silicon, or other suitable materials now known or hereinafter devised. A monolithic SiGe embodiment using active components results in certain advantages over the distributed network in the prior art. In one exemplary embodiment, RF signals undergo a neutral or slight positive power gain, rather than power losses that occur in the passive prior art systems. Furthermore, some exemplary embodiments employ differential signaling to improve signal isolation, interference rejection, and noise immunity, plus confine electromagnetic fields, when the RF signal is in analog form. In addition, in an exemplary embodiment, an active feed forward amplifier may be configured to provide power amplification greater than 30 dB.

Another advantage is that the active feed forward amplifier has wider operating bandwidths and can be configured for broadband enabled operation over multiple frequency bands. In other words, in an exemplary embodiment the feed forward amplifier is applicable to all frequency bands, including X, K, Ku, Ka, and Q bands. In an exemplary embodiment, the active feed forward amplifier operates over specific frequency ranges, such as 2-20 GHz, 20-40 GHz, 30-45 GHz, or other suitable ranges. In another exemplary embodiment, an active feed forward amplifier has a tunable bandwidth across a frequency range.

Additionally, other advantages over the prior art embodiments are possible, depending on the amplifier architecture. Some of the advantages include extensive system flexibility and very compact amplifier systems because no distributed structures are required. In an exemplary embodiment, another advantage is the feed forward amplifier being software reconfigurable for optimum cancellation of undesired signals. In yet another exemplary embodiment, the main amplifier may be any standalone amplifier while the remaining portions of the feed forward amplifier are monolithically implemented as a single integrated circuit as described herein.

Figure 4:
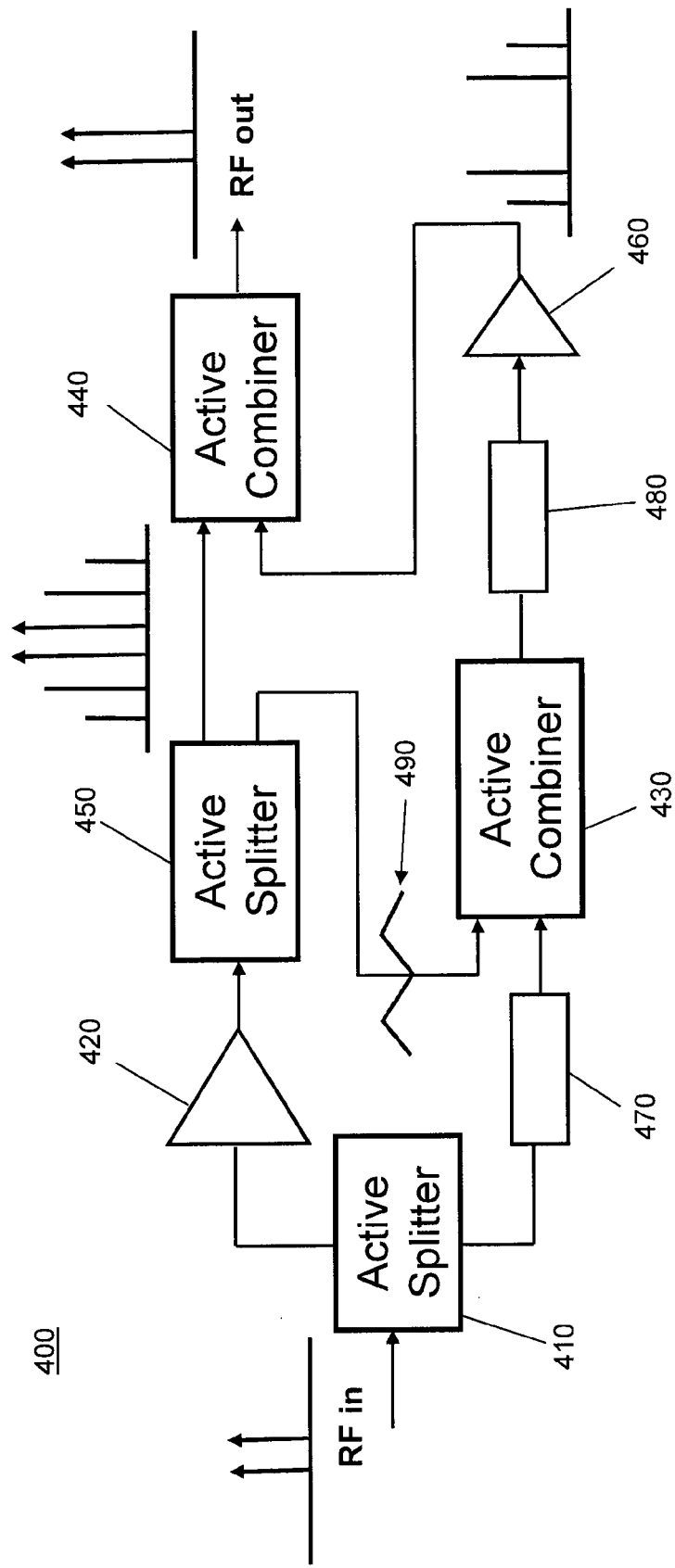
FIG. 4 illustrates an exemplary embodiment of an active feed forward amplifier.

In an exemplary embodiment, an active feed forward amplifier replaces a traditional feed forward amplifier by providing similar functionality in an integrated monolithic solution. In accordance with an exemplary embodiment and with reference to FIG. 4, an active feed forward amplifier 400 comprises a first active splitter 410, a main amplifier 420, a first active combiner 430, a second active combiner 440, a second active splitter 450, an error amplifier 460, a first vector generator 470, and a second vector generator 480. Active splitters 410, 450 may be of similar description as active splitter 100. Active combiners 430, 440 may be of similar description as active combiner 200. In addition, vector generators 470, 480 may be of similar description as vector generator 300.

In an exemplary embodiment, main amplifier 420 is connected at the input to first active splitter 410 and connected at the output to second active splitter 450. In turn, second active splitter 450 is connected at the output to second active combiner 440. Second active splitter 450 is also connected at the output to first active combiner 430 through a fixed attenuator 490. Also in the exemplary embodiment, first vector generator 470 is connected at the input to first active splitter 410 and connected at the output to first active combiner 430. Second vector generator 480 is connected at the input to first active combiner 430 and connected at the output to error amplifier 460. Furthermore, second active combiner 440 is connected at the input to second active splitter 450 and error amplifier 460.

At a general level, active feed forward amplifier 400 has two signal paths: a main amplifier path and an error amplifier path. Active splitter 410 receives and divides an undistorted RF input signal, with a first portion of the RF input signal communicated to the main amplifier path and a second portion of the RF input signal communicated to the error amplifier path. In the main amplifier path, main amplifier 420 is a high power, non-linear amplifier that amplifies the input signal to a desired level but also produces various spurious and intermodulation products. Main amplifier 420 receives the first RF signal portion and amplifies the signal, which is communicated to second active splitter 450. Second active splitter 450 divides the amplified first RF signal portion. Part of the signal is diverted to first active combiner 430, via fixed attenuator 490, in the error amplifier path. The remaining part of the signal is communicated to second active combiner 440.

In the error amplifier path, first vector generator 470 receives the second RF signal portion from first active splitter 410. First vector generator 470 is configured to provide amplitude adjustment and phase control of the unamplified, undistorted RF input signal. Specifically, first vector generator is configured to inject an approximate 180° phase shift. In another embodiment, first vector generator is further configured to provide fine amplitude adjustment to offset for imperfect coarse amplitude adjustment by fixed attenuator 490. In an exemplary embodiment, first vector generator 470 communicates a phase delayed RF signal to first active combiner 430. Similarly, first active combiner 430 also receives a sample of the amplified, distorted RF signal coupled to first active combiner 430 through main amplifier 420, second active splitter 450, and fixed attenuator 490.

Fixed attenuator 490 reduces the amplitude of the distorted RF signal without substantially increasing the waveform distortion. In an exemplary embodiment, fixed attenuator 490 reduces the amplitude of the distorted RF signal by an amount substantially equivalent to the amplification provided by main amplifier 420. This results in a signal similar to the original input signal but with the waveform distortion injected by main amplifier 420. In an exemplary embodiment, the phase difference between the two RF signals at the input to first active combiner 430 equals, or substantially equals, 180°. Therefore, in an exemplary embodiment, first active combiner 430 generates a combined RF signal representative of the undesired distortion products resulting from main amplifier 420 by cancelling out the desired portion of the spectrum.

In an exemplary embodiment, second vector generator 480 receives the error signal and performs additional phase and amplitude control as may be required to increase or optimize cancellation of the undesired distortion products in active combiner 440. In an exemplary embodiment, second vector generator 480 also compensates for loop delay between the main amplifier path and the error amplifier path. An adjusted error signal is output by second vector generator 480 and communicated to error amplifier 460. Error amplifier 460 amplifies the adjusted error signal and communicates the amplified error signal to second active combiner 440. In an exemplary embodiment, the amplification of the error signal substantially matches the amplification of the main RF signal by main amplifier 420. In another embodiment, the amplification of the error signal does not match the amplification of main amplifier 420. However, the waveform distortion injection by main amplifier is still reduced by subtracting the amplified error signal and the main RF signal.

Furthermore, second active combiner 440 receives the main RF signal and the amplified error signal. In an exemplary embodiment, the two inputs are combined and the error signal is subtracted from the main RF signal. In one embodiment, second active combiner 440 is configured to invert one of the input signals to facilitate the subtraction. In another embodiment, second vector generator 480 is configured to invert the amplified error signal prior to communicating the signal to second active combiner 440. In accordance with an exemplary embodiment, the output of second active combiner 440 is a linear signal. In an exemplary embodiment, active feed forward amplifier 400 is configured to improve the intermodulation distortion of an amplified signal by 30 dB or more in comparison to a comparable passive, prior art feed forward amplifier.

The following applications are related to this subject matter: U.S. application Ser. No. 12/759,123, entitled "ACTIVE BUTLER AND BLASS MATRICES," which is being filed contemporaneously herewith; U.S. application Ser. No. 12/759,043, entitled "ACTIVE HYBRIDS FOR ANTENNA SYSTEMS," which is being filed contemporaneously herewith; U.S. application Ser. No. 12/759,130, entitled "ACTIVE PHASED ARRAY ARCHITECTURE," which is being filed contemporaneously herewith; U.S. application Ser. No. 12/759,059, entitled "ACTIVE COMPONENT PHASED ARRAY ANTENNA," which is being filed contemporaneously herewith; U.S. application Ser. No. 12/758,996, entitled "PRESELECTOR AMPLIFIER," which is being filed contemporaneously herewith; U.S. application Ser. No. 12/759,148, entitled "ACTIVE POWER SPLITTER," which is being filed contemporaneously herewith; U.S. application Ser. No. 12/759,112, entitled "HALF-DUPLEX PHASED ARRAY ANTENNA SYSTEM," which is being filed contemporaneously herewith; U.S. application Ser. No. 12/759,113, entitled "DIGITAL AMPLITUDE CONTROL OF ACTIVE VECTOR GENERATOR," which is being filed contemporaneously herewith; the contents of which are hereby incorporated by reference for any purpose in their entirety.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

What is claimed is:

1. A feed forward amplifier having a main amplifier path and an error amplifier path, the feed forward amplifier comprising:
   a main amplifier in the main amplifier path;
   at least one active vector generator in the error amplifier path, wherein the at least one active vector generator is configured to adjust the phase and amplitude of an error amplifier path signal; and
   an error amplifier, in the error amplifier path, configured to receive the adjusted error amplifier path signal;
   wherein the at least one active vector generator comprises a first quadrant select in parallel with a second quadrant select and a first variable gain amplifier in parallel with a second variable gain amplifier.

2. A feed forward amplifier comprising at least one active vector generator configured to adjust the phase and amplitude of a signal in the feed forward amplifier, wherein the at least one active vector generator comprises a first quadrant select in parallel with a second quadrant select and a first variable gain amplifier in parallel with a second variable gain amplifier.

3. The feed forward amplifier of claim 2, wherein the feed forward amplifier is an integrated monolithic solution.

4. The feed forward amplifier of claim 2, wherein the at least one active vector generator is fabricated of silicon germanium (SiGe).

5. The feed forward amplifier of claim 2, wherein the feed forward amplifier is operable over multiple frequency bands.

6. A feed forward amplifier comprising:
    a first active splitter configured to receive an input signal and provide a first signal to a main amplifier path and a second signal to an error amplifier path;
    a main amplifier in the main amplifier path configured to receive the first signal and amplify to an amplified first signal;
    a second active splitter in the main amplifier path configured to receive the amplified first signal;
    a first active vector generator in the error amplifier path configured to receive the second signal, wherein the first active vector generator adjusts the phase and amplitude of the second signal;
    a first active combiner configured to combine an output signal from the first active vector generator and a first output signal from the second active splitter, wherein the first active combiner communicates a combined signal to a second active vector generator;
    an error amplifier in the error amplifier path, wherein the error amplifier receives a modified combined signal from the second active vector generator and is configured to provide an amplified error signal to a second active combiner;
    wherein the second active combiner combines the amplified error signal and a second output signal from the second active splitter, and wherein the second active combiner outputs a feed forward amplifier output signal; and
    wherein the first and second active vector generators individually comprise a first quadrant select in parallel with a second quadrant select and a first variable gain amplifier in parallel with a second variable gain amplifier.

7. The feed forward amplifier of claim 6, further comprising differential signaling to communicate a signal for at least a portion of the main amplifier path or the error amplifier path.

8. The feed forward amplifier of claim 6, wherein the feed forward amplifier has a tunable bandwidth across a frequency range of at least one decade.

9. The feed forward amplifier of claim 8, wherein the size of the first active combiner, the second active combiner, the first active splitter, the second active splitter and the active vector generator are individually independent of an operating frequency.

10. The feed forward amplifier of claim 6, wherein a signal communicated through at least one of the first active combiner, the second active combiner, the first active splitter, the second active splitter and the active vector generator does not incur a signal power loss in that component.

11. A feed forward amplifier comprising at least one active combiner configured to combine two or more input signals into a single output signal, wherein the at least one active vector generator comprises a first quadrant select in parallel with a second quadrant select and a first variable gain amplifier in parallel with a second variable gain amplifier, and wherein a digital controller provides control signals to the first and second quadrant selects and to the first and second variable gain amplifiers.

12. A method comprising:
    splitting, at a first active splitter, a feed forward amplifier input signal into a first signal and a second signal;
    receiving the first signal at a main amplifier and amplifying the first signal into an amplified first signal;
    splitting the amplified first signal at a second active splitter;
    adjusting the phase and amplitude of the second signal at a first active vector generator;
    combining, at a first active combiner, the output signal from the first active vector generator and a first output signal from the second active splitter to form a combined signal;
    communicating a modified combined signal from the first active combiner to a second active vector generator;
    amplifying, at an error amplifier, the combined signal from the second active vector generator into an amplified error signal; and
    combining, at a second active combiner, the amplified error signal and a second output signal from the second active splitter, wherein the second active combiner communicates a feed forward amplifier output signal;
    wherein the first and second active vector generators individually comprise a first quadrant select in parallel with a second quadrant select and a first variable gain amplifier in parallel with a second variable gain amplifier.

13. The feed forward amplifier of claim 1, wherein a digital controller controls the first and second quadrant selects and the first and second variable gain amplifiers of the at least one active vector generator.

14. The feed forward amplifier of claim 13, wherein the digital controller is reconfigurable to digitally control phase bits after the first and second at least one active vector generators are fabricated.

15. The feed forward amplifier of claim 1, wherein the first quadrant select and the second quadrant select are individually configured for phase inversion switching.

16. The feed forward amplifier of claim 1, wherein the at least one active vector generator further comprises a passive I/Q generator.

17. The feed forward amplifier of claim 16, wherein the at least one active vector generator controls the phase and amplitude of an RF signal by splitting the RF signal into two separate vectors, the in-phase (I) vector and the quadrature-phase (Q) vector, wherein the I vector and Q vector are processed in parallel, each passing through phase inverting switching performed by first and second quadrant selects.

18. The feed forward amplifier of claim 17, further comprising a current summer configured to receive the I vector and the Q vector and output a composite RG signal with phase and amplitude adjustments.

* * * * *